United States Patent
Yamazaki et al.

(10) Patent No.: US 10,329,200 B2
(45) Date of Patent: Jun. 25, 2019

(54) DIELECTRIC THIN FILM, CAPACITOR ELEMENT, AND ELECTRONIC COMPONENT

(71) Applicant: TDK CORPORATION, Tokyo (JP)

(72) Inventors: Kumiko Yamazaki, Tokyo (JP); Isao Nakahata, Tokyo (JP)

(73) Assignee: TDK CORPORATION, Tokyo (JP)

(*) Notice: Subject to any disclaimer, the term of this patent is extended or adjusted under 35 U.S.C. 154(b) by 0 days.

(21) Appl. No.: 15/765,150

(22) PCT Filed: Sep. 30, 2016

(86) PCT No.: PCT/JP2016/079151
§ 371 (c)(1),
(2) Date: Mar. 30, 2018

(87) PCT Pub. No.: WO2017/057745
PCT Pub. Date: Apr. 6, 2017

(65) Prior Publication Data
US 2018/0282229 A1    Oct. 4, 2018

(30) Foreign Application Priority Data
Oct. 2, 2015   (JP) .................... 2015-197035

(51) Int. Cl.
*C04B 35/00*   (2006.01)
*C04B 35/58*   (2006.01)
(Continued)

(52) U.S. Cl.
CPC ........ *C04B 35/58014* (2013.01); *C04B 35/00* (2013.01); *C04B 35/462* (2013.01);
(Continued)

(58) Field of Classification Search
CPC .............. C01B 21/0821; H01G 4/1254; H01G 4/1227; H01B 3/12
See application file for complete search history.

(56) References Cited

U.S. PATENT DOCUMENTS 4,734,390 A  *  3/1988  Marchand ........... C01B 21/0821
                                                         501/96.1
2013/0154443 A1    6/2013  Miura et al.

FOREIGN PATENT DOCUMENTS

| EP | 1078998 A2 | 2/2001 |
|----|-----------|--------|
| EP | 3392889 A1 | 10/2018 |
| EP | 3412793 A1 | 12/2018 |
| JP | S61-122108 A | 6/1986 |
| JP | 2013-1625 A | 1/2013 |

OTHER PUBLICATIONS

Marozau et al. Pulsed laser deposition and characterisation of perovskite-type LaTiO3xNx thin films. Acta Materialia 59 (2011) 7145-7154.*

(Continued)

*Primary Examiner* — Noah S Wiese
(74) *Attorney, Agent, or Firm* — Oliff PLC

(57) ABSTRACT

A dielectric thin film with high relative permittivity and high insulation can establish the amount of nitrogen in a metal oxynitride to be low. A dielectric thin film, wherein the dielectric composition is a metal oxynitride solid solution including Ma and Mb: a composition represented by the chemical formula $Ma_zMb_xO_xN_y$ (Ma is one element selected from Sr, Ba, Ca, La, Ce, Pr, Nd, and Na, Mb is one element selected from Ta, Nb, Ti and W, O is oxygen, and N is nitrogen); when a is the ionic valence exhibited when Ma occupies an A site in the perovskite structure and b is the ionic valence exhibited when Mb occupies a B site in the perovskite structure, a and b are $6.7 \leq a+b \leq 7.3$, and x, y and z are $0.8 \leq z \leq 1.2$, $2.450 \leq x \leq 3.493$, and $0.005 \leq y \leq 0.700$.

18 Claims, 2 Drawing Sheets

(51) Int. Cl.

| | |
|---|---|
| *C04B 35/462* | (2006.01) |
| *C23C 14/06* | (2006.01) |
| *C23C 14/24* | (2006.01) |
| *H01G 4/33* | (2006.01) |
| *H01B 3/00* | (2006.01) |
| *H01G 4/12* | (2006.01) |
| *C04B 35/622* | (2006.01) |
| *C04B 35/626* | (2006.01) |
| *C04B 35/634* | (2006.01) |
| *C04B 35/64* | (2006.01) |
| *C23C 14/28* | (2006.01) |

(52) U.S. Cl.
CPC .... *C04B 35/58007* (2013.01); *C04B 35/6262* (2013.01); *C04B 35/6264* (2013.01); *C04B 35/62218* (2013.01); *C04B 35/62655* (2013.01); *C04B 35/63416* (2013.01); *C04B 35/64* (2013.01); *C23C 14/06* (2013.01); *C23C 14/0676* (2013.01); *C23C 14/24* (2013.01); *C23C 14/28* (2013.01); *H01B 3/00* (2013.01); *H01G 4/12* (2013.01); *H01G 4/1209* (2013.01); *H01G 4/33* (2013.01); *C04B 2235/3895* (2013.01); *C04B 2235/604* (2013.01); *C04B 2235/606* (2013.01); *C04B 2235/96* (2013.01)

(56) References Cited

OTHER PUBLICATIONS

Le Paven-Thiven et al. Oxynitride perovskite LaTiOxNy thin films deposited by reactive sputtering. Progress in Solid State Chemistry vol. 35, Issues 2-4, 2007, pp. 299-308.*
I. Marozau et. al., "Pulsed Laser Deposition and Characterisation of Perovskite-Type LaTiO3-xNx Thin Films" SciVerse ScienceDirect, Acta Materialia, vol. 59, (2011), pp. 7145-7154.
Mirabbos Hojamberdiev et. al., "Fabrication of La2Ti2O7 Crystals Using an Alkali-Metal Molybdate Flux Growth Method and Their Nitridability to Form LaTiO2N Crystals Under a High-Temperature NH3 Atmosphere", Inorganic Chemistry, vol. 54, (2015), pp. 3237-3244.
Dec. 20, 2016 Search Report issued in International Patent Application No. PCT/JP2016/079151.
Apr. 12, 2018 Preliminary Report on Patentability issued in International Patent Application No. PCT/JP2016/079151.
Apr. 17, 2019 Extended Search Report issued in European Patent Application No. 16851914.8.
Le Paven C et. al.: Journal of Crystal Growth, vol. 413, 2015, pp. 5-11.
Daichi Oka et. al.: Scientific Reports, vol. 4, No. 1, May 2015, pp. 1-6.

* cited by examiner

DIELECTRIC THIN FILM, CAPACITOR ELEMENT, AND ELECTRONIC COMPONENT

TECHNICAL FIELD

The present invention relates to a dielectric thin film, a capacity element provided with the dielectric thin film, and an electronic component.

BACKGROUND ART

The number of electronic components mounted on the electronic circuit board is increasing in accordance with the multifunctionalization of electronic devices in recent years. The electronic devices are also being miniaturized, and it is strongly desired to improve the packaging density of electronic components for achievement in both multifunctionalization and miniaturization of the components. For improvement in the packaging density, it is necessary to enhance the performance and miniaturization of various kinds of electronic components, and miniaturization and high performance of thin film capacitors, which are one of the electronic components, are also demanded increasingly strongly.

Conventionally, metal oxide materials have been widely used as dielectric materials for the thin film capacitors, and the improvement in material properties have been advanced for many years so as to obtain thin film electronic components having higher functions. However, the improvement in properties of electronic components based on metal oxides has been reaching its limit, and new materials having higher properties are strongly required.

For further improvement in properties of the thin film capacitors, materials having high dielectric properties other than metal oxides have been recently developed. Examples of the materials having high dielectric properties other than metal oxides include a metal oxynitride material where a part of oxygen atoms of oxygen octahedron having a perovskite crystal structure is substituted with a nitrogen atom. Incidentally, the perovskite structure is a structure typically represented by $ABX_3$ (X; O, N, C, F).

Patent Literature 1 discloses a technique relating to a metal oxynitride having a specific permittivity of 11000, which exceeds the relative permittivity obtained with the conventional barium titanate. However, this relative permittivity is not measured from a bulk sintered body obtained by sintering grains of metal oxynitride as an ordinary dielectric, but is calculated from pellets obtained by performing a CIP pressing to the powder of metal oxynitride. It is difficult to obtain sufficient insulation property with such a powder green compact.

Patent Literature 2 discloses that relative permittivity of a sintered body of a metal oxynitride having a perovskite structure is evaluated and its frequency dependency is small, but does not clearly disclose the value of the relative permittivity. In addition, Patent Literature 2 does not verify whether the sintered body of the produced oxynitride has a sufficient insulation property.

Non-Patent Literature 1 describes an oxide ferroelectric having a perovskite layered structure different from the above-mentioned perovskite structure. In Non-Patent Literature 1, substances having a perovskite layered structure are mainly classified into three groups. The first is a substance called Ruddlesden-Popper type and represented by the general formula of $A_{m+1}B_mO_{3m+1}$. Specific examples of the first includes $La_{2-x}Sr_xCuO_4$, which is a high temperature superconducting oxide. The second type is a substance called Aurevilleus type and represented by the general formula of $A_{m-1}Bi_2B_mO_{3m+3}$. Specific examples of the second type include $SrBi_2Ta_2O_9$, which is a Bi based ferroelectric material expected to be applied to a ferroelectric thin film memory. The third is a substance called a perovskite slab structure and represented by the general formula of $A_nB_nO_{3n+2}$. In case of n=4 in the general formula of $A_nB_nO_{3n+2}$, the substance is represented by a composition formula of $A_2B_2O_7$. Representative examples of such a substance include $Sr_2Ta_2O_7$ and $La_2Ti_2O_7$.

On the other hand, there is a substance having a pyrochlore structure as a structure represented by the same composition formula of $A_2B_2O_7$. Specifically, examples of this substance include $Dy_2Ti_2O_7$, which is a magnetic body. Incidentally, it is generally known that the pyrochlore structure has the same composition formula as that of the perovskite structure, but its crystal structure and dielectric property are greatly different from those of the perovskite structure.

Non-Patent Literature 2 discloses that a metal oxynitride raw material powder and a carbon powder are fired at a high temperature to obtain a metal oxynitride as a sintered body.

CITATION LIST

Patent Literature

Patent Literature 1: JP 2013-1625A
Patent Literature 2: 61-122108 A

Non-Patent Literature

Non-Patent Literature 1: Yukikuni AKISIGE and Misako KAMATA, December 2002, *Crystal Chemistry of A2B2O7 Type Oxide Ferroelectrics with Perovskite-related Layered Structure*, Bulletin (Natural Sciences) of the Faculty of Education of Shimane University, Vol. 36, pp. 65-69

Non-Patent Literature 2: Wenbin Dai et al., Journal of the Ceramic Society of Japan, 115, 1, 42-46 (2007)

SUMMARY OF INVENTION

Technical Problem

Patent Literature 2 discloses that a high relative permittivity is achieved by obtaining a sintered body of a solid solution of metal oxynitrides having a perovskite structure and represented by a composition formula of $ABO_2N$ or $ABON_2$ having stoichiometric ratios of oxygen and nitrogen.

It is conceivable that the high relative permittivity appears as a result of easy distortion of a crystal due to introduction of nitrogen ions having a strong covalent bond into the oxygen ion site of the perovskite structure of the metal oxynitrides.

However, the introduction of nitrogen ions causes a problem of decrease in insulation property necessary for functioning as a dielectric composition when a large amount of nitrogen is contained in the metal oxynitrides as the material ($ABO_2N$ or $ABON_2$) shown in Patent Literature 2.

Thus, in case of the material containing a large content of nitrogen as disclosed in Patent Literature 2, insulation property decreases easily, and there is a high possibility that an accurate relative permittivity is not measured.

Meanwhile, a measure to reduce an amount of nitrogen ions to be introduced is conceivable for improvement in insulation property, but when the amount of nitrogen ions to be introduced is reduced, it becomes difficult to maintain a perovskite structure of the metal oxynitride, and a metal oxide phase having a low relative permittivity, such as a pyrochlore structure and a perovskite type layered structure, ends up appearing. Thus, when the amount of nitrogen ions to be introduced is small, there is a problem that a mixture of a metal oxide and a metal oxynitride is formed, it is difficult to obtain a high relative permittivity, which is a feature of a metal oxynitride having a perovskite structure, and it is difficult to achieve both high relative permittivity and high insulation at the same time.

Furthermore, Patent Literature 2 does not disclose that both high insulation property and high relative permittivity can be achieved at the same time in a region where the content of nitrogen is smaller than the stoichiometric ratio by forming a solid solution having an intermediate composition between the metal oxide and the metal oxynitride.

A thin film obtained by a vapor phase growth method or so has a structure different from the sintered body disclosed in Patent Literature 2 due to a difference in its forming method. However, a thin film of a metal oxynitride containing a large amount of nitrogen (e.g., a substance having a perovskite structure represented by a composition formula of $ABO_2N$) is also known to exhibit a high relative permittivity, but is hard to achieve both high relative permittivity and high insulation property at the same time in a region where the content of nitrogen is small for the same reason as the sintered body.

The present invention has been achieved under such conventional problems. It is an object of the invention to provide a dielectric thin film and a capacity element provided with the dielectric thin film capable of achieving both high relative permittivity and high insulation property at the same time even if an amount of nitrogen contained in the metal oxynitride is controlled to be low.

Solution to Problem

The present inventors have found out that a metal oxynitride having a perovskite structure can be stably formed as a solid solution due to a dielectric thin film having a predetermined composition, and have achieved the present invention.

The dielectric thin film according to the present invention achieved to overcome the above-mentioned problems includes the following embodiments.

[1] A dielectric thin film consisting of a dielectric composition containing a dielectric having a perovskite structure, wherein the dielectric composition has a composition represented by a chemical formula of $Ma_zMbO_xN_y$ (Ma is one or more elements selected from Sr, Ba, Ca, La, Ce, Pr, Nd, and Na, Mb is one or more elements selected from Ta, Nb, Ti, and W, O is oxygen, and N is nitrogen), a relation of $6.7 \leq a+b \leq 7.3$ is satisfied, where a is an ionic valence when Ma occupies an A site of the perovskite structure, and b is an ionic valence when Mb occupies a B site of the perovskite structure, x, y, and z of the chemical formula satisfy $0.8 \leq z \leq 1.2$, $2.450 \leq x \leq 3.493$, and $0.005 \leq y \leq 0.700$, and the dielectric composition is a metal oxynitride solid solution containing Ma and Mb.

[2] A dielectric thin film consisting of a dielectric composition containing a dielectric having a perovskite structure, wherein the dielectric composition has a composition represented by a chemical formula of $Ma_zMbO_xN_y$ (Ma is one or more elements selected from Sr, Ba, Ca, La, Ce, Pr, Nd, and Na, Mb is one or more elements selected from Ta, Nb, Ti, and W, O is oxygen, and N is nitrogen), a relation of $6.7 \leq a+b \leq 7.3$ is satisfied, where a is an ionic valence when Ma occupies an A site of the perovskite structure, and b is an ionic valence when Mb occupies a B site of the perovskite structure, x, y, and z of the chemical formula satisfy $0.8 \leq z \leq 1.2$, $2.450 \leq x \leq 3.493$, and $0.005 \leq y \leq 0.700$, and a peak intensity of a maximum intensity among peak intensities of diffracted X-rays not attributed to the perovskite structure is 0 or more and 10 or less when a peak intensity of a maximum intensity among peak intensities of diffracted X-rays attributed to the perovskite structure is 100 in an X-ray diffraction pattern of the dielectric thin film.

When the dielectric thin film of the metal oxynitride having the above-mentioned features is used, a high relative permittivity is obtained even if an amount of nitrogen contained in the metal oxynitride is controlled to be low, and both high relative permittivity and high insulation property can be thus achieved at the same time.

[3] The dielectric thin film according to [2], wherein a peak of the maximum intensity among the peak intensities of the diffracted X-rays attributed to the perovskite structure and a peak of the maximum intensity among the peak intensities of the diffracted X-rays not attributed to the perovskite structure are present in a range of $2\theta=30$ to $35°$.

[4] The dielectric thin film according to [2] or [3], wherein the diffracted X-rays not attributed to the perovskite structure are diffracted X-rays attributed to a perovskite slab structure.

[5] A dielectric thin film including a perovskite structure represented by a chemical formula of $Ma_zMbO_xN_y$ (Ma is a metal ion located in an A site of the perovskite structure, Mb is a metal ion located in a B site of the perovskite structure, O is oxygen ion, and N is nitrogen ion), wherein a relation of $a+b=7.0$ is satisfied, where a and b are respectively an average valence of Ma and Mb, x, y, and z of the chemical formula satisfy $0.8 \leq z \leq 1.2$, $2.450 \leq x \leq 3.493$, and $0.005 \leq y \leq 0.700$, and the dielectric thin film is composed of a solid solution between a metal oxide composed of Ma and Mb and a metal oxynitride composed of Ma and Mb.

When the dielectric thin film of the metal oxynitride having the above-mentioned features is used, a high relative permittivity is obtained even if an amount of nitrogen contained in the metal oxynitride is controlled to be low, and both high relative permittivity and high insulation property can be thus achieved at the same time.

[6] Preferably, a peak intensity derived from the metal oxide composed of Ma and Mb in $2\theta=30°$ to $35°$ is 0 or more and 10 or less when a peak intensity of a maximum intensity derived from the metal oxynitride composed of Ma and Mb in $2\theta=30°$ to $35°$ is 100 at the time of an XRD analysis by CuKα1 radiation (wavelength of 1.54056 Å) in the perovskite structure.

When the peak intensity is controlled in the above range, an action of enhancing insulation property can be strengthened. As a result, both high relative permittivity and further high insulation property can be achieved at the same time.

[7] Preferably, Ma is one or more elements selected from Sr, Ba, Ca, La, Ce, Pr, Nd, and Na, and Mb is one or more elements selected from Ta, Nb, Ti, and W.

Selecting the above elements makes it possible to increase an action of stably forming the solid solution between the metal oxide and the metal oxynitride having the perovskite structure.

A favorable embodiment of the present invention is preferably a capacity element having the dielectric thin film. When the dielectric composition according to the present invention is used, it is possible to provide a capacity element, such as a thin film capacitor, having a high electrostatic capacitance not conventionally obtained.

Advantageous Effects of Invention

The present invention can provide the dielectric thin film and the capacity element capable of achieving both a high relative permittivity (e.g. 1000 or more) and a high insulation ($10^{10}$ Ωcm or more) even if an amount of nitrogen contained in the metal oxynitride is controlled to be small.

DESCRIPTION OF EMBODIMENTS

Figure 1:
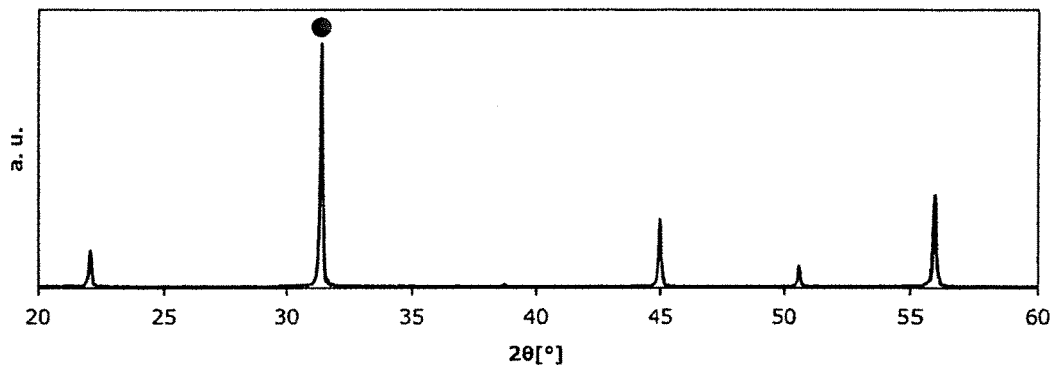
FIG. 1 is an X-ray diffraction pattern (Comparative Example 1 of the present invention) of a prepared metal oxynitride of $SrTaO_2N$.

Hereinafter, an embodiment of the present invention will be described. A dielectric thin film according to a first aspect of the present invention is a dielectric thin film consisting of a dielectric composition having a perovskite structure. The dielectric composition has a composition represented by a chemical formula of $Ma_zMbO_xN_y$. (Ma is one or more elements selected from Sr, Ba, Ca, La, Ce, Pr, Nd, and Na, Mb is one or more elements selected from Ta, Nb, Ti, and W, O is oxygen, and N is nitrogen). A dielectric having a perovskite structure is a solid solution of an oxide and a nitride where oxygen of a part of an octahedron formed by oxygen is substituted by nitrogen.

In case of $x=2$ and $y=1$ in the chemical formula, the dielectric composition is represented as $Ma_zMbO_2N$ containing oxygen and nitrogen at a stoichiometric ratio and is present as a metal oxynitride solid solution having a stable perovskite structure. From a viewpoint of securing insulation property of the metal oxynitride having a perovskite structure, however, a content of nitrogen in $Ma_zMbO_2N$ is large. In the present embodiment, a content of nitrogen (y) is thus smaller than 1 in the metal oxynitride solid solution having a perovskite structure.

Specifically, y is 0.005 or more, preferably 0.300 or more, and more preferably 0.500 or more. On the other hand, y is 0.700 or less, preferably 0.600 or less. Incidentally, an effect obtained due to the metal oxynitride solid solution is not sufficiently obtained in case of y<0.005, and insulation property is not obtained in case of y>0.700. The above-mentioned effect is a high relative permittivity obtained from a crystal strain due to the covalent bonding property of N. Even when "y" is within the above range, the dielectric thin film according to the present embodiment exists as a metal oxynitride solid solution whose perovskite structure is maintained.

The content (y) of nitrogen (valence is −3) decreases for compensating charge in the above chemical formula, and a content (x) of oxygen (valence is −2) is correspondingly larger than 2 in the present embodiment.

Specifically, x is 2.450 or more, preferably 2.600 or more. On the other hand, x is 3.493 or less, preferably 3.050 or less, and more preferably 2.750 or less. Incidentally, insulation property is not obtained in case of x<2.450, and the effect obtained due to the metal oxynitride solid solution is not sufficiently obtained in case of x>3.493. The above-mentioned effect is a high relative permittivity obtained from a crystal strain due to the covalent bonding property of N.

In the above chemical formula, z is an abundance ratio of Ma and Mb in the dielectric composition. In the present embodiment, z is 0.8 or more, preferably 0.9 or more. On the other hand, z is 1.2 or less, preferably 1.1 or less. Incidentally, insulation property deteriorates in case of z<0.8, and in case of z>1.2, when Ma is Sr, for example, a segregation of SrO etc. is generated, and relative permittivity tends to decrease.

In case of z>1.0, y mentioned above is preferably in the range of 0.500 or more and 0.700 or less.

A relation of $6.7 \leq a+b \leq 7.3$ is satisfied, where a is an ionic valence when Ma occupies an A site of the perovskite structure, and b is an ionic valence when Mb occupies a B site of the perovskite structure In the present embodiment, each of the ionic valence a and the ionic valence b is represented as an average valence. The average valence is a value obtained by averaging a valence of ions present in the A site or the B site based on their abundance ratio. For example, a case where Sr and La are present at a ratio of 4:1 in the A site will be described. The valence of Sr ion in the perovskite structure is 2, and the valence of La ion in the perovskite structure is 3. Thus, the average valence a in the A site is calculated by the following (Formula 1), and a is 2.2.

(Formula 1)

$$\begin{aligned}\text{(Average valence a in the above case)} &= \\ 2(\text{valence of } Sr \text{ ion}) \times 4/5 &(\text{abundance ratio of } Sr \text{ ion}) + \\ 3(\text{valence of } La \text{ ion}) \times 1/5 &(\text{abundance ratio of } La \text{ ion}) = \\ &8/5 + 3/5 = 11/5 = 2.2\end{aligned} \quad (1)$$

Likewise, a case where Ta and Ti are present at a ratio of 4:1 in the B site will be described. The valence of Ta ion in the perovskite structure is 5, and the valence of Ti ion in the perovskite structure is 4. Thus, the average valence b in the B site is calculated by the following (Formula 2), and b is 4.8.

(Formula 2)

$$\begin{aligned}\text{(Average valence b in the above case)} &= \\ 5(\text{valence of } Ta \text{ ion}) \times 4/5 &(\text{abundance ratio of } Ta \text{ ion}) + \\ 4(\text{valence of } Ti \text{ ion}) \times 1/5 &(\text{abundance ratio of } Ti \text{ ion}) = \\ &20/5 + 4/5 = 24/5 = 4.8\end{aligned} \quad (2)$$

Incidentally, in the calculation of the total of the average valences of the present application, z=1 is handled even in case of A site rich or B site rich, that is, even in case of z≠1. For example, in the above case, even in case of z=1.2, the total (a+b) of the average valences is 2.2+4.8=7.0.

In the present embodiment, when the sum "a+b" of the ionic valence a and the ionic valence b represented as the average valence is within the range of 6.7 to 7.3, the perovskite structure formed by MaMbO$_2$N at ordinary temperature and ordinary pressure is stabilized, and thus Ma$_z$MbO$_x$N$_y$, which has a nitrogen content lower than that of MaMbO$_2$N, also easily forms a perovskite structure. For example, in case of a+b=6.0, the perovskite structure of MaMbO$_2$N is not stabilized, and thus a uniform solid solution is not obtained. On the other hand, in case of a+b=8.0, the perovskite structure of MaMbON$_2$ is stabilized. The perovskite structure of MaMbON$_2$ requires more N than the perovskite structure of MaMbO$_2$N, and thus it becomes more difficult to obtain insulation property.

The element of Ma is one or more elements selected from Sr, Ba, Ca, La, Ce, Pr, Nd, and Na. The element of Mb is one or more elements selected from Ta, Nb, Ti, and W. In particular, it is preferable that Ma be Sr and Mb be Ta.

The solid solution of the metal oxynitride having a perovskite structure is easily obtained by above-mentioned combination.

A dielectric thin film according to a second aspect of the present invention is a dielectric thin film consisting of a dielectric composition containing a dielectric having a perovskite structure. The dielectric composition has a composition represented by a chemical formula of Ma$_z$MbO$_x$N$_y$ (Ma is one or more elements selected from Sr, Ba, Ca, La, Ce, Pr, Nd and Na, Mb is one or more elements selected from Ta, Nb, Ti and W, O is oxygen, and N is nitrogen), and "x", "y" and "z" in the chemical formula overlap with the explanation of the dielectric thin film according to the first aspect and thus will not be explained. Furthermore, the ion valence a, the ion valence b, and the sum (a+b) thereof also overlap with the explanation of the dielectric thin film according to the first aspect and thus will not be explained.

In the dielectric thin film according to the second aspect, a peak of diffracted X-rays attributed to the perovskite structure appears in an X-ray diffraction pattern. This is a peak attributed to the dielectric contained in the dielectric thin film, and is a peak attributed to a metal oxynitride having a perovskite structure in the present embodiment. Thus, since the dielectric thin film has the metal oxynitride with a predetermined composition having a perovskite structure, the dielectric thin film containing this metal oxynitride can achieve both a high relative permittivity and a high insulation property at the same time. In the X-ray diffraction pattern of the dielectric thin film, a peak of diffracted X-rays not attributed to a perovskite structure may exist within a range where both a high relative permittivity and a high insulation property are achieved at the same time.

Specifically, a peak intensity of a maximum intensity among peak intensities of diffracted X-rays not attributed to the perovskite structure is 0 or more and 10 or less when a peak intensity of a maximum intensity among peak intensities of diffracted X-rays attributed to the perovskite structure is 100. When the peak intensity is larger than 0, a phase having a perovskite structure and a phase having no perovskite structure coexist, and such a dielectric thin film is in a state of a so-called mixed crystal. However, an abundance ratio of a substance having no perovskite structure is very smaller than that of a substance having a perovskite structure, and both a high relative permittivity and a high insulation property can be thus achieved at the same time.

The structure other than the perovskite structure is not limited, but a substance having a perovskite structure in a mixed crystal state is preferably a substance capable of maintaining the perovskite structure. In the present embodiment, the structure other than the perovskite structure is preferably a perovskite slab structure. As described later, a material having a perovskite slab structure is preferable as a raw material for forming the dielectric thin film (for example, a target for film formation), and the perovskite structure and the perovskite slab structure can coexist as a mixed crystal in the thin film within the composition range represented by the above-mentioned chemical formula. A compound having a perovskite slab structure does not exhibit a high relative permittivity, but can achieve both a high relative permittivity and a high insulation property provided that the peak intensity of the perovskite slab structure is within the above range.

Incidentally, as described above, the pyrochlore structure is represented by the same composition formula as the perovskite slab structure, but when a substance having a pyrochlore structure is present, a substance having a perovskite structure is hard to maintain its perovskite structure, and a substance having a pyrochlore structure and a substance having a perovskite structure tend to be unable to coexist. Thus, when the dielectric thin film contains a substance having a pyrochlore structure, a high relative permittivity and a high insulation property are not obtained.

For example, when the metal oxide of Ma$_2$Mb$_2$O$_7$ containing no nitrogen has a perovskite slab structure, the solid solution of the metal oxynitride containing Ma and Mb easily maintains a perovskite structure by using such a metal oxide as a raw material. Specifically, Sr$_2$Ta$_2$O$_7$, Sr$_2$Nb$_2$O$_7$, Ca$_2$Nb$_2$O$_7$, Na$_2$W$_2$O$_7$, La$_2$Ti$_2$O$_7$, Ce$_2$Ti$_2$O$_7$, Pr$_2$Ti$_2$O$_7$, and Nd$_2$Ti$_2$O$_7$ have a perovskite slab structure. Although it is said that Ba$_2$Ta$_2$O$_7$ does not exist, (SrBa)$_2$Ta$_2$O$_7$ has a perovskite slab structure.

Meanwhile, Pb$_2$Ta$_2$O$_7$, Cd$_2$Ta$_2$O$_7$, Y$_2$Si$_2$O$_7$, Cr$_2$Ti$_2$O$_7$, Tb$_2$Ge$_2$O$_7$, Sc$_2$Si$_2$O$_7$, and the like, which are combinations of elements other than the elements exemplified as Ma and Mb, have a pyrochlore structure. Thus, a perovskite structure is not obtained even if attempting to form a solid solution of a metal oxynitride using these metal oxides.

Preferably, a peak intensity of the maximum intensity among the peak intensities of the diffracted X-rays attributed to the perovskite structure and a peak intensity of the maximum intensity among the peak intensities of the diffracted X-rays not attributed to the perovskite structure are both in a range of 2θ=30 to 35°.

A dielectric thin film according to a third aspect of the present invention is a dielectric thin film including a perovskite structure represented by a chemical formula of Ma$_z$MbO$_x$N$_y$ (Ma is a metal ion located in an A site of the perovskite structure, Mb is a metal ion located in a B site of the perovskite structure, O is oxygen ion, and N is nitrogen ion). As with the dielectric thin films according to the first and second aspects, x, y, and z of the chemical formula satisfy $0.8 \leq z \leq 1.2$, $2.450 \leq x \leq 3.493$, $0.005 \leq y \leq 0.700$. Preferred ranges of "x", "y" and "z" are also the same as those of the dielectric thin films according to the first and second aspects.

A relation of a+b=7.0 is satisfied, where a and b are respectively an average valence of Ma and Mb. Incidentally, the average valence a and the average valence b can be obtained in the same manner as the dielectric thin films according to the first and second aspects. In case of a+b=7.0, the perovskite structure formed by MaMbO$_2$N at ordinary temperature and ordinary pressure is stabilized, and thus $Ma_zMbO_xN_y$, having a nitrogen content lower than that of $MaMbO_2N$ also easily forms a perovskite structure. In case of a+b=6.0, the perovskite structure of $MaMbO_2N$ is not stabilized, and thus a uniform solid solution is not obtained. On the other hand, in case of a+b=8.0, the perovskite structure of $MaMbON_2$ is stabilized. The perovskite structure of $MaMbON_2$ requires more N than the perovskite structure of $MaMbO_2N$, and thus it becomes more difficult to obtain insulation property.

Furthermore, the dielectric thin film according to the third aspect is composed of a solid solution between a metal oxide composed of Ma and Mb and a metal oxynitride composed of Ma and Mb. Here, "a solid solution between a metal oxide composed of Ma and Mb and a metal oxynitride composed of Ma and Mb" represents a solid solution having a composition where a metal oxide composed of Ma and Mb and a metal oxynitride composed of Ma and Mb are mixed at a predetermined ratio.

In other words, "a solid solution between a metal oxide composed of Ma and Mb and a metal oxynitride composed of Ma and Mb" represents an intermediate composition between a metal oxide composed of Ma and Mb and a metal oxynitride composed of Ma and Mb.

For example, when a metal oxide composed of Ma and Mb is represented by $Ma_2Mb_2O_7$ and a metal oxynitride composed of Ma and Mb is represented by $MaMbO_2N$, the composition of "a solid solution between a metal oxide composed of Ma and Mb and a metal oxynitride composed of Ma and Mb" is represented by $Ma_zMbO_xN_y$, and "x" indicating the content of "O" is within a range of 2.450 to 3.493. "y" indicating the content of "N" is within a range of 0.005 to 0.700.

On the other hand, when the metal oxide and the metal oxynitride are merely in a mixed state, not the solid solution, the influence of relative permittivity of the metal oxide having a low permittivity increases, and it is thus hard to obtain a high relative permittivity as the dielectric composition.

Thus, in case of "a solid solution between a metal oxide composed of Ma and Mb and a metal oxynitride composed of Ma and Mb" having a predetermined composition, a metal oxide phase having a pyrochlore structure or a perovskite type layer structure with a low relative permittivity is generated, and it becomes possible to prevent a dielectric composition from being a mixture of the metal oxynitride and the metal oxide and becomes possible to achieve both a high relative permittivity and a high insulation property.

Figure 4:
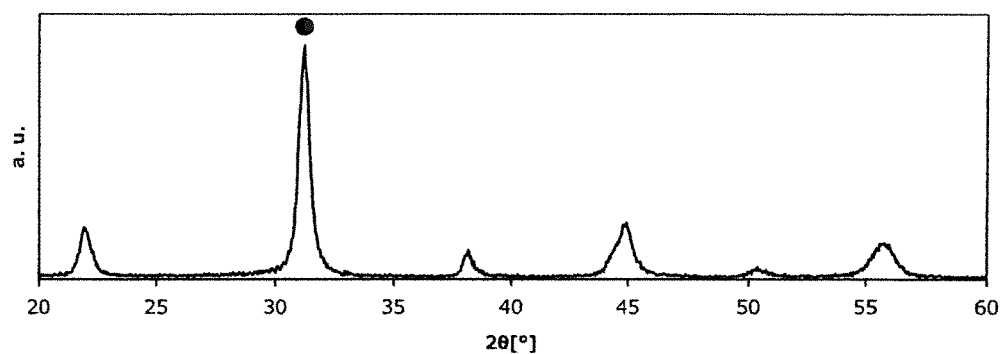
FIG. 4 is an X-ray diffraction pattern (Example 2 of the present invention) of a solid solution between a prepared metal oxide of $Sr_2Ta_2O_7$ (when applying a stress) and a prepared metal oxynitride of $SrTaO_2N$.

In the perovskite structure of the solid solution of the metal oxide and the metal oxynitride described above, a peak intensity derived from the metal oxide in 2θ=30° to 35° as shown in FIG. 4 is desirably close to 0 and is preferably 0 or more and 10 or less when a peak intensity of a maximum intensity derived from the metal oxynitride of $MaMbO_2N$ in 2θ=30° to 35° is 100 at the time of an XRD analysis by CuKα1 radiation (wavelength of 1.54056 Å). Here, the peak derived from the metal oxide means a peak due to the structure of the raw material used for forming the thin film.

Figure 2:
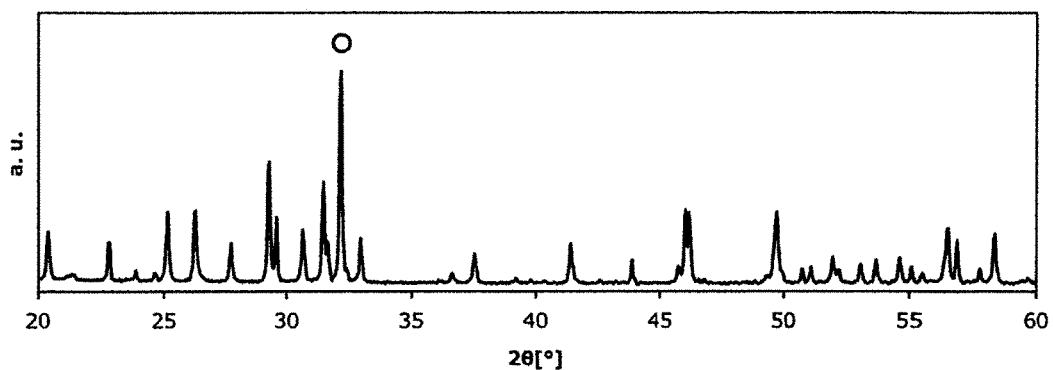
FIG. 2 is an X-ray diffraction pattern (Comparative Example 5 of the present invention) of a prepared metal oxide of $Sr_2Ta_2O_7$ (ordinary temperature and ordinary pressure).
Figure 3:
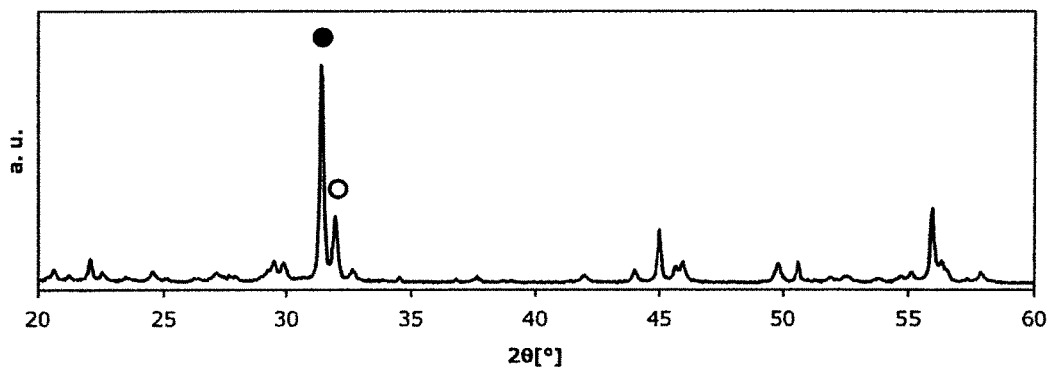
FIG. 3 is an X-ray diffraction pattern (Comparative Example 3 of the present invention) between a mixed crystal of a prepared metal oxynitride and a prepared a metal oxide.

With such a dielectric thin film, higher relative permittivity and insulation property can be obtained. Incidentally, when the intensity derived from the metal oxide is larger than 10 as shown in FIG. 3, the effect of enhancing the insulation property is small. In FIG. 1 to FIG. 4, black circles ● are peaks derived from the metal oxynitride (perovskite structure), and white circles ○ are peaks derived from the metal oxide (perovskite slab structure).

The dielectric thin film according to the present embodiment is a dielectric deposited film formed by depositing elements constituting the dielectric thin film by a thin film forming method or the like. When formed as such a dielectric deposited film, unlike a sintered body obtained by firing a powder, both a high insulation property and a high relative permittivity can be achieved at the same time by receiving an influence of a stress at the time of being formed on a substrate or by having less oxygen defects even in a region where a content of nitrogen is smaller than that of the metal oxynitride having a perovskite structure.

The dielectric thin film preferably has a thickness of 10 nm to 2 μm. In case of less than 10 nm, insulation breakdown is generated easily. In case of more than 2 μm, industrial superiority to metal oxide dielectric thin films such as $BaTiO_3$, which is less expensive, is weakened.

Next, the capacity element according to the present embodiment will be described. The capacity element referred to here is an element utilizing dielectricity, and examples of the capacity element include a capacitor, a thermistor, a filter, a diplexer, a resonator, a transmitter, an antenna, a piezoelectric element, a transistor (using a dielectric insulating film as a gate), and a ferroelectric memory.

Incidentally, the dielectric thin film of the present invention may contain other elements within a range where the effect of the present invention is not impaired, and may also contain other elements inevitably introduced in the manufacturing process and storage conditions.

Hereinafter, a thin film capacitor containing the above-mentioned dielectric thin film and contained in the above-mentioned capacitor will be specifically described as the capacity element. There is no clear definition of the structure of the thin film capacitor, but in general, the number of dielectric layers of the thin film capacitor is smaller than that of the multilayer capacitor or is one, and the thin film capacitor is used when it is necessary to further reduce the size and the height. The thin film capacitor is often required to have a higher relative permittivity due to limited layers, and the present invention is a particularly preferable device.

Figure 5:
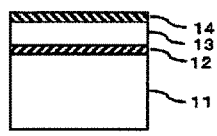
FIG. 5 is a schematic view of a thin film capacitor.

FIG. 5 shows a schematic view of a thin film capacitor as an example of the capacity element according to the present embodiment. In the thin film capacitor shown in FIG. 5, a lower electrode 12 and a dielectric film 13 are formed in this order on a support substrate 11, and an upper electrode 14 that functions as the other electrode of the thin film capacitor is provided on the surface of the dielectric film 13. The upper electrode 14 is formed by any conductive materials and can be formed by a similar material to that of the lower electrode 12.

Here, the thickness, shape, and the like of each layer is adjusted based on the application, and there is no need that each layer necessarily consists of one layer. For example, the upper electrode 14 has only to function as an electrode and preferably has a film thickness of 0.01 μm or more. When the film thickness is 0.01 μm or less, the conductivity is deteriorated, and thus this film thickness is not preferable as the upper electrode 14.

Hereinafter, a method for manufacturing the dielectric thin film according to the present embodiment will be described.

First, a method for forming a metal oxynitride film as a thin film will be described. There are no particular restrictions on the film forming method used for forming the metal oxynitride to which the composition of the present invention is applied as long as a film satisfying the above chemical formula is obtained. The film forming method includes various kinds of thin film forming methods, such as a vacuum evaporation method, a sputtering method, a pulse laser deposition method (PLD), a metal organic chemical vapor deposition method (MO-CVD), a metal organic decomposition method (MOD), a sol-gel method, and a chemical solution deposition method (CSD). Among the thin film forming methods, a known vapor phase growth method, such as a sputtering method, a chemical vapor deposition method, and PLD, is preferable.

The raw materials used in forming the dielectric thin film (evaporation material, various target materials, organometallic materials, etc.) may contain minute impurities and subcomponents, but there is no problem unless the impurities largely decrease insulation property.

In the present embodiment, the PLD method as one of the film forming methods will be described. The PLD method as an example of the film forming methods capable of being used for forming the dielectric film 13 is a method where a target containing constituent elements of an objective film is placed in a film forming chamber, a pulsed laser is irradiated on the target surface, the target surface is instantly evaporated by the strong energy to generate a plume, and evaporated material is deposited on the substrate arranged opposite to the target to form a thin film.

In addition to the metal oxide sintered body containing film constituent elements, examples of the target may include an alloy, a nitride sintered body, and a metal oxynitride sintered body containing film constituent elements. In the target, each element is preferably distributed on average on the scale of the pulse laser diameter to be used, but is not necessarily distributed uniformly within a range where the quality of the metal oxynitride film to be obtained is not affected. The target is not necessarily single, but a plurality of targets containing a part of the film constituent elements may be prepared and used for forming the film. The target has an optimum shape appropriately selected in accordance with a film forming apparatus to be used.

In the present embodiment, examples of the target may include a metal oxide sintered body containing film constituent elements prepared using a typical solid phase method.

In the present embodiment, oxynitridation of the film further needs to be performed so as to obtain the metal oxynitride film. Examples of the method for oxynitridation include a method of introducing nitrogen radicals into a deposition chamber during deposition of a metal oxide film, a method of using reactive sputtering using nitrogen gas or so, a plasma treatment using nitrogen activated by plasma nitridation. These methods can introduce nitrogen into the crystal structure of the metal oxide thin film without using a toxic gas. Alternatively, these methods can directly form the metal oxynitride on the substrate without interposing the metal oxide thin film. The partial oxidation treatment of the nitride film may be also used. In the present embodiment, the metal oxynitride is obtained preferably by introducing nitrogen used for nitridation when forming a film using a metal oxide raw material.

A method of forming a dielectric thin film having a composition of $SrTaO_{3.2}N_{0.2}$ will be described below as a more detailed example of the embodiment. As a target, a sintered body target of $Sr_2Ta_2O_7$ may be used. In the present embodiment, a Si single crystal substrate, which is easy to obtain and inexpensive, is preferably used as the substrate. $SiO_2$, $TiO_x$, and Pt are deposited in this order on a Si single crystal substrate to form a Pt lower electrode. Subsequently, a dielectric film is formed on the Pt lower electrode by a PLD method so as to have a thickness of 200 nm, for example. To expose a part of the lower electrode, a region where the dielectric film is not partially formed is formed on the lower electrode using a metal mask.

In the present embodiment, for crystallization of the film, the deposition is preferably conducted by heating the substrate with an infrared laser to 600° C. to 800° C. At this time, caution is required because the film is not crystallized if the substrate temperature is too low, and if the temperature is too high, cracking or the like occurs due to a difference in thermal expansion between the substrate and the film during cooling. However, since the optimum value of the temperature of the substrate at the time of deposition varies depending on the constituent elements and composition, the optimum conditions are selected accordingly, and the temperature range is not limited to the above range.

It is known that the Curie temperature of the metal oxynitride is high, and the film forming temperature is typically equal to or lower than the Curie temperature. Thus, no structural phase transition occurs at the time of lowering the film forming temperature to room temperature after the film formation. Thus, as compared with the thin film of barium titanate having a Curie temperature of around 100° C., the thin film of the metal oxynitride is characterized in that cracking is difficult to occur.

Various types of gases and gas pressures can be used during the film formation. The state of the film thus obtained also depends on the size of the deposition chamber and the position of the gas introduction pipe. That is, even if the same partial pressure is used, the same film is not necessarily obtained. Thus, attention should be paid to Sr ions, that is, Ma and Ta ions, that is, the ratio of Mb. This ratio varies with the gas pressure, and thus the gas pressure is favorably adjusted depending on the apparatus so as to achieve a desired composition ratio. In particular, the composition of the metal oxynitride contains O and N, and thus attention should be also paid to the ratio between the oxygen partial pressure and the nitrogen partial pressure. In this case, the partial pressure ratio and total pressure are preferably adjusted depending on the apparatus so as to obtain a desired composition.

In a region where the content of nitrogen is small such as $SrTaO_{3.2}N_{0.2}$, a nitridation treatment to the metal oxide film may be performed by introducing nitrogen radicals after forming a metal oxide thin film formed by using the target. The amount of nitrogen in the formed sample can be confirmed by an X-ray photoelectron spectroscopy. The determination of nitrogen can be performed by using the internal standard of the X-ray photoelectron spectrometer, but is preferably performed by calculating the sensitivity factor from the nitride single crystal wafer such as AlN and correcting the quantitative value. The degree of progress of oxidation or nitridation varies depending on the constituent elements, and thus the introduction amount of the nitrogen radicals is appropriately adjusted depending on the selected element group.

In this way, in the present embodiment, the oxynitride film of $SrTaO_{3.2}N_{0.2}$ formed as described above is used as the dielectric film layer, and Pt as the upper electrode is formed on the upper surface thereof by the sputtering method to form a thin film capacitor.

The electrostatic capacitance of the thin film capacitor is measured using an impedance analyzer by connecting a wire to the upper electrode and the lower electrode via probes. After the measurement of the electrostatic capacitance, a cross section of the metal oxynitride film is observed using a scanning electron microscope, and a thickness d of the metal oxynitride film is measured from the observation image. From the electrostatic capacity C, the thickness d of the metal oxynitride film, and the overlapping area S of the upper electrode and the lower electrode obtained as described above, the relative permittivity (ε) of the metal oxynitride film is calculated using the following formula (3).

(Formula 3)

$$C = \varepsilon_0 \varepsilon (S/d) \quad (3)$$

Here, $\varepsilon_0$ is the permittivity of vacuum. A relative permittivity is preferably higher for obtaining a high electrostatic capacitance in the thin film capacitor.

Incidentally, the present invention is not limited by the above embodiment or examples described later. In addition, components in the embodiment and examples include ones easily assumed by a person skilled in the art, ones substantially identical to, and so-called equivalents. Furthermore, the components disclosed in the embodiment and examples may be appropriately combined or may be appropriately selected and used.

In recent years, the form of capacity elements has diversified due to responses to high frequency and miniaturization, and not all of the form can be described. The capacity element of the present invention represents an element that positively utilizes its dielectric properties or an element whose dielectric properties are indispensable in configuration for function expression, and does not include the other electronic devices accidentally having the capacitor component.

Hereinafter, examples and comparative examples of the present invention will be shown.

Example 1 to Example 7 and Comparative Example 1 to Comparative Example 5

In Examples 1 to 7 and Comparative Example 4, thin films were formed. $SrCO_3$, $Ta_2O_5$, $La_2O_3$, $TiO_2$, $Na_2CO_3$, and $WO_3$ were used as raw materials of sintered bodies used as targets for film formation. Each of the raw materials was weighed to be $Sr_2Ta_2O_7$, $La_2Ti_2O_7$, and $Na_2W_2O_7$ and mixed for 16 hours with a wet ball mill using ethanol as a solvent. The obtained mixed slurry was dried at 80° C. for 12 hours in a constant temperature drier. The obtained mixture was lightly crushed in a mortar, placed in a ceramic crucible, and heat-treated in an electric furnace at 1000° C. for 2 hours in the air atmosphere to obtain a calcined product.

The obtained calcined product was pulverized again in the wet ball mill using ethanol as a solvent for 16 hours. After the pulverization, the slurry was dried at 80° C. for 12 hours with the constant temperature drier to obtain a pulverized product. A polyvinyl alcohol solution as a binder was added to the pulverized product thus obtained in an amount of 0.6% by weight in terms of solid matter in solution and mixed to obtain a green compact. The green compact was pressed into a cylindrical shape having a diameter of about 23 mm and a height of about 9 mm to obtain a pressed product. The pressed product was fired in an electric furnace at 1400° C. for 2 hours in the air atmosphere, and the upper surface and the lower surface of the sintered product were mirror-polished to a height of 5 mm to obtain a target for film formation. Each of the targets obtained at this time had a perovskite slab structure, and its relative density was 96 to 98%.

The target for film formation obtained as described above was set in a film forming apparatus, and a Si substrate having a Pt film as a lower electrode on its surface was placed opposite to the target. In Examples 1 to 7, films were formed so that a thickness of 200 nm was obtained by a PLD method with introduction of nitrogen radicals. At this time, gas pressures of oxygen and nitrogen were controlled to obtain a desired structures shown in Table 1. The thin films were confirmed to be crystallized from the X-ray diffraction patterns of the obtained samples. On the other hand, in Comparative Example 4, film formation was performed under conditions close to vacuum so that the crystal structure of the oxide target was reflected as it was, and then N (nitrogen) was doped.

In Comparative Example 1 to Comparative Example 3 and Comparative Example 5, metal oxides of $Sr_2Ta_2O_7$, $La_2Ti_2O_7$, and $Na_2W_2O_7$ were synthesized in the same manner as in the procedure for synthesizing the above-mentioned target. Thereafter, nitridization was performed by the carbon thermal reduction method as described in Non-Patent Literature 2. The nitridization is also possible by a normal ammonia atmosphere, but the carbon thermal reduction method makes it possible to control the amount of N to be introduced by the corresponding additive amount of C.

The metal oxide powder kneaded with carbon was pelletized and subjected to a heat treatment. The heat treatment was performed in a batch furnace capable of reducing the pressure at 1400° C. to obtain a sintered body after the pressure inside the furnace had been once sufficiently reduced and the furnace was filled with $N_2$ atmosphere at atmospheric pressure. After the nitridization, no residual C was confirmed. Pt electrodes were formed on the obtained samples by sputtering, and electric properties were evaluated. Incidentally, in Comparative Example 5, the above-mentioned heat treatment was performed by pelletizing the metal oxide powder without kneading carbon.

The amounts of N and O in the samples of Example 1 to Example 7 and Comparative Example 1 to Comparative Example 5 were determined by an impulse heating melt extraction method (infrared absorption method) using a TC600 manufactured by LECO. The valence of the metal ion was judged from the chemical shift of XPS, but there was no change in the valence as compared with the raw materials.

Table 1 summarizes crystal structure, insulation property, and relative permittivity (ε) of Example 1 to Example 7 and Comparative Example 1 to Comparative Example 5.

The written values of the relative permittivity (ε) are ones evaluated at a voltage of 1 Vrms/μm and a frequency of 1 kHz. Incidentally, an upper electrode for evaluating the relative permittivity was formed by depositing Ag in a size of 100 μm in diameter. Table 1 shows only values of the relative permittivity (ε) when tan δ is less than 100%. In Table 1, dielectricity is considered to be unable to be evaluated when tan δ is 100% or more, and the relative permittivity (ε) was represented as x (not observed).

XRD patterns were measured by CuKα1 radiation (wavelength of 1.54056 Å).

Insulation property was evaluated by measuring specific resistance values. The specific resistance values were measured using ADVANTEST R8340A, and a voltage of 1 V/μm was applied for the measurement. In Table 1, insulation property is ◯ (good) when a specific resistance is $10^{10}$ Ωcm or more, and insulation property is X (bad) when a specific resistance is smaller than $10^{10}$ Ωcm.

TABLE 1

| | Ma Element kind | Mb Element kind | a Valence | b Valence | a + b Valence | z | x | y | Presence of perovskite structure | Intensity ratio of metal oxide * | Perovskite solid solution | Insulation property $\geq 10^{10}$ Ω cm | ε |
|---|---|---|---|---|---|---|---|---|---|---|---|---|---|
| Comp. Ex. 1 | Sr | Ta | 2 | 5 | 7.0 | 1.0 | 2.000 | 1.000 | ○(observed) | 0 | ○(satisfied) | X(bad) | X(not observed) |
| Comp. Ex. 2 | Sr | Ta | 2 | 5 | 7.0 | 1.0 | 2.450 | 0.700 | ○(observed) | 12 | X(not satisfied) | X(bad) | X(not observed) |
| Ex. 1 | Sr | Ta | 2 | 5 | 7.0 | 1.0 | 2.450 | 0.700 | ○(observed) | 0 | ○(satisfied) | ○(good) | 2100 |
| Comp. Ex. 3 | Sr | Ta | 2 | 5 | 7.0 | 1.0 | 2.750 | 0.500 | ○(observed) | 33 | X(not satisfied) | X(bad) | X(not observed) |
| Ex. 2 | Sr | Ta | 2 | 5 | 7.0 | 1.0 | 2.750 | 0.500 | ○(observed) | 0 | ○(satisfied) | ○(good) | 2200 |
| Ex. 3 | Sr | Ta | 2 | 5 | 7.0 | 1.0 | 3.200 | 0.200 | ○(observed) | 0 | ○(satisfied) | ○(good) | 1600 |
| Comp. Ex. 4 | Sr | Ta | 2 | 5 | 7.0 | 1.0 | 3.350 | 0.100 | ○(observed) | 95 | X(not satisfied) | X(bad) | X(not observed) |
| Ex. 4 | Sr | Ta | 2 | 5 | 7.0 | 1.0 | 3.493 | 0.005 | ○(observed) | 0 | ○(satisfied) | ○(good) | 1200 |
| Comp. Ex. 5 | Sr | Ta | 2 | 5 | 7.0 | 1.0 | 3.500 | 0.000 | X(not observed) | ∞ | X(not satisfied) | ○(good) | 50 |
| Ex. 5 | Sr | Ta | 2 | 5 | 7.0 | 1.0 | 2.450 | 0.700 | ○(observed) | 10 | ○(satisfied) | ○(good) | 1000 |
| Ex. 6 | La | Ti | 3 | 4 | 7.0 | 1.0 | 3.200 | 0.200 | ○(observed) | 0 | ○(satisfied) | ○(good) | 1800 |
| Ex. 7 | Na | W | 1 | 6 | 7.0 | 1.0 | 3.200 | 0.200 | ○(observed) | 0 | ○(satisfied) | ○(good) | 1200 |

"*" means an intensity ratio of a main peak of the metal oxide when an intensity of a main peak of the metal oxynitride is considered to be 100, only provided that the metal oxide has a perovskite slab structure.

In the column described as "perovskite solid solution" of Table 1, those having an intensity ratio of the metal oxide of 0 or more and 10 or less were written as 0 (satisfied), and meanwhile, those having an intensity ratio of the metal oxide of more than 10 had a perovskite structure derived from the metal oxynitride appeared on their pattern but were judged that the perovskite structure was not a solid solution with the oxide and written as X (not satisfied).

Comparative Example 1 is a sintered body of a metal oxynitride of $SrTaO_{2.000}N_{1.000}$, which was also shown from composition analysis and XRD analysis. Comparative Example 1 having a clear X-ray peak shown in FIG. 1 had a perovskite structure, but was confirmed that insulation property could not be secured because the amount of N was large. Comparative Example 2 is a sintered body and is confirmed that insulation property could not be secured even when the intensity ratio of the main peak of the metal oxide was 12 when the intensity of the main peak of the metal oxynitride was considered to be 100.

Comparative Example 5 is a sintered body of a metal oxide of $Sr_2Ta_2O_7$ having a perovskite slab structure, which was also shown from composition analysis and XRD analysis. FIG. 2 shows the clear XRD pattern obtained. In Comparative Example 5, a sufficient insulation property was obtained, but ε was a low value of 50.

Comparative Example 3 is a sintered body having an intermediate composition between a metal oxynitride of $SrTaO_{2.000}N_{1.000}$ and a metal oxide of $Sr_2Ta_2O_7$. Comparative Example 3 was not a solid solution, and a sufficient insulation property was thus not obtained. The XRD pattern is shown in FIG. 3. FIG. 3 shows that there exist the peak of the perovskite structure derived from the metal oxynitride and the peak of the perovskite slab structure derived from the metal oxide, and that these phases are in a mixed crystal state. In FIG. 3, the black circle ● is a peak derived from the metal oxynitride, and the white circle ○ is a peak derived from the metal oxide. The intensity ratio was calculated using these two peaks.

Comparative Example 4 was a thin film doped with N after forming $Sr_2Ta_2O_7$ having a perovskite slab structure. In Comparative Example 4, almost no solid solution of the metal oxynitride having the perovskite structure was formed, and the abundance ratio of the perovskite slab structure remained high. As a result, the electrical properties were evaluated with the same shape as the example, but no insulation property was obtained.

On the other hand, in Example 1, a metal oxynitride solid solution having a perovskite structure was formed sufficiently, and a sufficient insulation property was obtained. The relative permittivity ε was a high value of 2100.

Likewise, in Examples 2 to 7, a metal oxynitride solid solution having a perovskite structure was also formed, and a sufficient insulation property and a high dielectricity were obtained. In particular, Example 2 showed a high relative permittivity ε of 2200. The XRD pattern of Example 2 is shown in FIG. 4. It was confirmed that a perovskite structure was obtained even though the composition ratio was the same as that of Comparative Example 3 shown in FIG. 3.

Incidentally, it was confirmed that a high insulation property and a high relative permittivity ε can be secured in case of a thin film in a mixed crystal state of a phase having a perovskite structure and a phase having a perovskite slab structure with a controlled intensity ratio of 10 as Example 5. Thus, it turned out that both high relative permittivity and high insulation property can be obtained at the same time by setting the intensity ratio of the main peak of the metal oxide to 10 or less when the intensity of the main peak of the metal oxynitride is considered to be 100.

Example 8 to Example 15 and Comparative Example 6 and Comparative Example 7

In Examples 8 to 15, targets of metal oxides were prepared using the same manner as in Example 1, thinned (nitrided at the time of the thinning), and synthesized. Incidentally, each of the targets was adjusted to have the composition of the thin film shown in Table 2. Incidentally, cells where two kinds of elements are written in the columns of Ma and Mb in Table 2 have a mixing ratio of 80% and 20% in order from the left. For example, in Example 8, the target $(Sr_{0.8}Ba_{0.2})_2Ta_2O_7$ was prepared by adjusting the ratio of $SrCO_3$ and $BaCO_3$ as raw materials so that Sr was 80% and Ba was 20% in the A site. At this time, both Sr ion and Ba ion are divalent, and thus a=2 is satisfied. Example 15 was also prepared in the same manner as in Example 8. In Example 15, the target $(La_{0.8}Na_{0.2})_2(Ti_{0.8}W_{0.2})_2O_7$ was prepared by adjusting the ratio of $SrCO_3$, $Na_2CO_3$, $TiO_2$, and $WO_3$ as raw materials so that La was 80% and Na was 20% in the A site and Ti was 80% and W was 20% in the B site. At this time, La ion is trivalent, Na ion is monovalent, Ti ion is tetravalent, and W ion is hexavalent, and a and b are thus as follows.

a=3×0.8+1×0.2=2.4+0.2=2.6
b=4×0.8+6×0.2=3.2+1.2=4.4

Thin films were prepared using the prepared targets. Electric properties of the obtained samples were evaluated. The results are summarized in Table 2. Table 2 shows values of ε evaluated at a voltage of 1 Vrms/μm and a frequency of 1 kHz. In all Examples 8 to 15, ε was a high value of 1000 or more.

On the other hand, Comparative Example 6 and Comparative Example 7 were synthesized using compositions outside the present invention to prepare targets for film formation. Each of the obtained metal oxide targets had a pyrochlore structure. The films were tried to be a metal oxynitride solid solution of having a perovskite structure, but the obtained thin films did not have a perovskite structure, and insulation property was not obtained.

TABLE 2

| | Ma Element kind | Mb Element kind | a Valence | b Valence | a + b Valence | z | x | y | Presence of perovskite structure | Intensity ratio of metal oxide * | Perovskite solid solution | Insulation property ≥$10^{10}$ Ω cm | ε |
|---|---|---|---|---|---|---|---|---|---|---|---|---|---|
| Ex. 8 | Sr, Ba | Ta | 2 | 5 | 7.0 | 1.0 | 3.200 | 0.200 | ○(observed) | 0 | ○(satisfied) | ○(good) | 2000 |
| Ex. 9 | Ca, Sr | Ta | 2 | 5 | 7.0 | 1.0 | 2.600 | 0.600 | ○(observed) | 0 | ○(satisfied) | ○(good) | 1600 |
| Ex. 10 | Nd | Ti | 3 | 4 | 7.0 | 1.0 | 2.750 | 0.500 | ○(observed) | 0 | ○(satisfied) | ○(good) | 1900 |
| Ex. 11 | La, Ce | Ti | 3 | 4 | 7.0 | 1.0 | 2.900 | 0.400 | ○(observed) | 0 | ○(satisfied) | ○(good) | 1400 |
| Ex. 12 | La, Nd | Ti | 3 | 4 | 7.0 | 1.0 | 2.900 | 0.400 | ○(observed) | 0 | ○(satisfied) | ○(good) | 2200 |
| Ex. 13 | La, Pr | Ti | 3 | 4 | 7.0 | 1.0 | 2.900 | 0.400 | ○(observed) | 0 | ○(satisfied) | ○(good) | 1300 |
| Ex. 14 | Sr | Ta, Nb | 2 | 5 | 7.0 | 1.0 | 3.350 | 0.100 | ○(observed) | 0 | ○(satisfied) | ○(good) | 1300 |
| Ex. 15 | La, Na | Ti, W | 2.6 | 4.4 | 7.0 | 1.0 | 3.200 | 0.200 | ○(observed) | 0 | ○(satisfied) | ○(good) | 1600 |
| Comp. Ex. 6 | Dy | Ti | 3.0 | 4.0 | 7.0 | 1.0 | 3.200 | 0.200 | X(not observed) | pyrochlore | X(not satisfied) | x(bad) | X(not observed) |
| Comp. Ex. 7 | La | Zr | 3.0 | 4.0 | 7.0 | 1.0 | 3.200 | 0.200 | X(not observed) | pyrochlore | X(not satisfied) | xthen(bad) | X(not observed) |

"*" means an intensity ratio of a main peak of the metal oxide when an intensity of a main peak of the metal oxynitride is considered to be 100, only provided that the metal oxide has a perovskite slab structure.

Example 16 to Example 19 and Comparative Example 8 and Comparative Example 9

In Example 16 to Example 19 and Comparative Example 8 and Comparative Example 9, targets of metal oxides were prepared in the same manner as in Example 1, thinned (nitrided at the time of the thinning), and synthesized. Each of the targets was adjusted to have the compositions of the thin films shown in Table 3. Electric properties of the obtained samples were evaluated. The results are summarized in Table 3. Table 3 shows values of ε evaluated at a voltage of 1 Vrms/μm and a frequency of 1 kHz.

TABLE 3

| | Ma Element kind | Mb Element kind | a Valence | b Valence | a + b Valence | z | x | y | Presence of perovskite structure | Intensity ratio of metal oxide * | Perovskite solid solution | Insulation property ≥$10^{10}$ Ω cm | ε |
|---|---|---|---|---|---|---|---|---|---|---|---|---|---|
| Comp. Ex. 8 | La | Ti | 3 | 4 | 7.0 | 0.7 | 3.200 | 0.200 | ○(observed) | 0 | ○(satisfied) | X(bad) | X(not observed) |
| Ex. 16 | Sr | Ta | 2 | 5 | 7.0 | 0.8 | 3.200 | 0.200 | ○(observed) | 0 | ○(satisfied) | ○(good) | 1000 |
| Ex. 17 | La | Ti | 3 | 4 | 7.0 | 0.9 | 3.200 | 0.200 | ○(observed) | 0 | ○(satisfied) | ○(good) | 1200 |
| Ex. 18 | Sr | Ta | 2 | 5 | 7.0 | 1.1 | 3.200 | 0.200 | ○(observed) | 0 | ○(satisfied) | ○(good) | 1100 |
| Ex. 19 | La | Ti | 3 | 4 | 7.0 | 1.2 | 3.200 | 0.200 | ○(observed) | 0 | ○(satisfied) | ○(good) | 1000 |
| Comp. Ex. 9 | Sr | Ta | 2 | 5 | 7.0 | 1.3 | 3.200 | 0.200 | ○(observed) | 0 | ○(satisfied) | ○(good) | 600 |

"*" means an intensity ratio of a main peak of the metal oxide when an intensity of a main peak of the metal oxynitride is considered to be 100, only provided that the metal oxide has a perovskite slab structure.

Table 3 shows that insulation property was not obtained in Comparative Example 8. On the other hand, in Comparative Example 9, insulation property was obtained, but permittivity was a relatively low value. When observing the fine structure of Comparative Example 9, segregation of SrO was confirmed.

Example 20 and Example 21 and Comparative Example 10 and Comparative Example 11

In Example 20 and Example 21 and Comparative Example 10 and Comparative Example 11, targets of metal oxides were prepared in the same manner as in Example 1, thinned (nitrided at the time of the thinning), and synthesized. Each of the targets was adjusted to have the compositions of the thin films shown in Table 4. Electric properties of the obtained samples were evaluated. The results are summarized in Table 4.

TABLE 4

| | Ma Element kind | Mb Element kind | a Valence | b Valence | a + b Valence | z | x | y | Presence of perovskite structure | Intensity ratio of metal oxide * | Perovskite solid solution | Insulation property $\geq 10^{10}$ Ω cm | ε |
|---|---|---|---|---|---|---|---|---|---|---|---|---|---|
| Comp. Ex. 10 | Sr, La | Ta | 2.5 | 5.0 | 7.5 | 1.0 | 3.150 | 0.400 | ○(observed) | 0 | ○(satisfied) | X(bad) | X(not observed) |
| Ex. 20 | Sr, La | Ta | 2.3 | 5.0 | 7.3 | 1.0 | 3.050 | 0.400 | ○(observed) | 0 | ○(satisfied) | ○(sood) | 1100 |
| Ex. 21 | Sr, La | Ti | 2.7 | 4.0 | 6.7 | 1.0 | 2.750 | 0.400 | ○(observed) | 0 | ○(satisfied) | ○(good) | 1000 |
| Comp. Ex. 11 | Sr, La | Ti | 2.5 | 4.0 | 6.5 | 1.0 | 2.650 | 0.400 | ○(observed) | 0 | ○(satisfied) | X(bad) | X(not observed) |

"*" means an intensity ratio of a main peak of the metal oxide when an intensity of a main peak of the metal oxynitride is considered to be 100, only provided that the metal oxide has a perovskite slab structure.

It was confirmed from Table 4 that in Comparative Examples 10 and 11, insulation property cannot be obtained, and dielectricity cannot be evaluated.

INDUSTRIAL APPLICABILITY

According to the present invention, the dielectric thin film has a crystal structure similar to a crystal structure where N is stoichiometric even in a region where N is smaller than the stoichiometric ratio, and it is thus possible to provide a dielectric element exhibiting a high resistance and a high permittivity. In particular, it is possible to provide a dielectric thin film and a capacity element suitable for products requiring compactness, high temperature response, and high frequency selectivity.

REFERENCE SIGNS LIST

11 . . . support substrate
12 . . . lower electrode
13 . . . dielectric film
14 . . . upper electrode

The invention claimed is:

1. A dielectric thin film consisting of a dielectric composition containing a dielectric having a perovskite structure, wherein
the dielectric composition has a composition represented by a chemical formula of $Ma_zMbO_xN_y$ (Ma is one or more elements selected from Sr, Ba, Ca, La, Ce, Pr, Nd, and Na, Mb is one or more elements selected from Ta, Nb, Ti, and W, O is oxygen, and N is nitrogen),
a relation of $6.7 \leq a+b \leq 7.3$ is satisfied, where a is an ionic valence when Ma occupies an A site of the perovskite structure, and b is an ionic valence when Mb occupies a B site of the perovskite structure,
x, y, and z of the chemical formula satisfy $0.8 \leq z \leq 1.2$, $2.450 \leq x \leq 3.493$, and $0.005 \leq y \leq 0.700$,
the dielectric composition is a metal oxynitride solid solution containing Ma and Mb, and
a specific resistance of the dielectric thin film is $10^{10}$ Ωcm or more.

2. A capacity element comprising the dielectric thin film according to claim 1.

3. An electronic component comprising the dielectric thin film according to claim 1.

4. An electronic component comprising the capacity element according to claim 2.

5. A dielectric thin film consisting of a dielectric composition containing a dielectric having a perovskite structure, wherein
the dielectric composition has a composition represented by a chemical formula of $Ma_zMbO_xN_y$ (Ma is one or more elements selected from Sr, Ba, Ca, La, Ce, Pr, Nd, and Na, Mb is one or more elements selected from Ta, Nb, Ti, and W, O is oxygen, and N is nitrogen),
a relation of $6.7 \leq a+b \leq 7.3$ is satisfied, where a is an ionic valence when Ma occupies an A site of the perovskite structure, and b is an ionic valence when Mb occupies a B site of the perovskite structure,
x, y, and z of the chemical formula satisfy $0.8 \leq z \leq 1.2$, $2.450 \leq x \leq 3.493$, and $0.005 \leq y \leq 0.700$,
a peak intensity of a maximum intensity among peak intensities of diffracted X-rays not attributed to the perovskite structure is 0 or more and 10 or less when a peak intensity of a maximum intensity among peak intensities of diffracted X-rays attributed to the perovskite structure is 100 in an X-ray diffraction pattern of the dielectric thin film, and
a specific resistance of the dielectric thin film is $10^{10}$ Ωcm or more.

6. The dielectric thin film according to claim 5, wherein a peak of the maximum intensity among the peak intensities of the diffracted X-rays attributed to the perovskite structure and a peak of the maximum intensity among the peak intensities of the diffracted X-rays not attributed to the perovskite structure are present in a range of 2θ=30° to 35°.

7. The dielectric thin film according to claim 5, wherein the diffracted X-rays not attributed to the perovskite structure are diffracted X-rays attributed to a perovskite slab structure.

8. The dielectric thin film according to claim 6, wherein the diffracted X-rays not attributed to the perovskite structure are diffracted X-rays attributed to a perovskite slab structure.

9. A dielectric thin film comprising a perovskite structure represented by a chemical formula of $Ma_zMbO_xN_y$ (Ma is a metal ion located in an A site of the perovskite structure, Mb is a metal ion located in a B site of the perovskite structure, O is oxygen ion, and N is nitrogen ion), wherein
- a relation of a+b=7.0 is satisfied, where a and b are respectively an average valence of Ma and Mb,
- x, y, and z of the chemical formula satisfy $0.8 \leq z \leq 1.2$, $2.450 \leq x \leq 3.493$, and $0.005 \leq y \leq 0.700$,
- the dielectric thin film is composed of a solid solution between a metal oxide composed of Ma and Mb and a metal oxynitride composed of Ma and Mb, and
- a specific resistance of the dielectric thin film is $10^{10}$ Ωcm or more.

10. The dielectric thin film according to claim 9, wherein a peak intensity derived from the metal oxide composed of Ma and Mb in 2θ=30° to 35° is 0 or more and 10 or less when a peak intensity of a maximum intensity derived from the metal oxynitride composed of Ma and Mb in 2θ=30° to 35° is 100 at the time of an XRD analysis by CuKα1 radiation (wavelength of 1.54056 Å) in the perovskite structure.

11. The dielectric thin film according to claim 9, wherein Ma is one or more elements selected from Sr, Ba, Ca, La, Ce, Pr, Nd, and Na, and Mb is one or more elements selected from Ta, Nb, Ti, and W.

12. The dielectric thin film according to claim 10, wherein Ma is one or more elements selected from Sr, Ba, Ca, La, Ce, Pr, Nd, and Na, and Mb is one or more elements selected from Ta, Nb, Ti, and W.

13. A capacity element comprising the dielectric thin film according to claim 5.

14. A capacity element comprising the dielectric thin film according to claim 9.

15. An electronic component comprising the dielectric thin film according to claim 5.

16. An electronic component comprising the dielectric thin film according to claim 9.

17. An electronic component comprising the capacity element according to claim 13.

18. An electronic component comprising the capacity element according to claim 14.

* * * * *